(12) United States Patent
Modelli

(10) Patent No.: US 6,557,138 B1
(45) Date of Patent: Apr. 29, 2003

(54) METHOD FOR CORRECTION OF ERRORS IN A BINARY WORD STORED IN MULTI-LEVEL MEMORY CELLS, WITH MINIMUM NUMBER OF CORRECTION BITS

(75) Inventor: Alberto Modelli, Milan (IT)

(73) Assignee: STMicroelectronics S.r.l., Agrat Brianza (IT)

(*) Notice: Subject to any disclaimer, the term of this patent is extended or adjusted under 35 U.S.C. 154(b) by 0 days.

(21) Appl. No.: 09/500,707

(22) Filed: Feb. 9, 2000

(30) Foreign Application Priority Data

Feb. 10, 1999 (EP) ............................. 99830070

(51) Int. Cl.[7] .................. H03M 13/00; G06F 11/10
(52) U.S. Cl. .................................... 714/753
(58) Field of Search .................. 714/753, 758, 714/763, 755

(56) References Cited

U.S. PATENT DOCUMENTS

| | | | |
|---|---|---|---|
| 4,589,112 A | * 5/1986 | Karim | 714/753 |
| 5,450,363 A | 9/1995 | Christopherson et al. | 365/205 |
| 5,475,693 A | 12/1995 | Christopherson et al. | 714/710 |
| 5,550,849 A | * 8/1996 | Harrington | 714/752 |
| 5,621,682 A | 4/1997 | Tanzawa et al. | 365/185.03 |
| 5,745,508 A | * 4/1998 | Prohofsky | 714/763 |
| 5,754,566 A | 5/1998 | Christopherson et al. | 714/773 |
| 5,754,753 A | * 5/1998 | Smelser | 714/8 |
| 5,956,351 A | * 9/1999 | Bossen et al. | 714/756 |
| 6,233,717 B1 | * 5/2001 | Choi | 714/805 |

FOREIGN PATENT DOCUMENTS

EP    0 709 776 A1    5/1996

OTHER PUBLICATIONS

Golay, M. J.E., "Notes on Digital Coding," *Proc. IRE* 37:657, Jun. 1949.

Hamming, R.W., "Error Detecting and Error Correcting Codes," *Bell Syst. Tech. J.* 29:147–160, Apr. 1950.

"Error Correction and Detection Circuit for Multiple Memory Types," *IBM Technical Disclosure Bulletin* 30(11):376–377, Apr. 1988.

Adámek, J., *Foundations of Coding: Theory and Applications of Error–Correcting Codes with an Introduction to Cryptography and Information Theory*, John Wiley & Sons, Inc., New York, 1991, Chap. V, "Binary Linear Codes," pp. 63–78.

\* cited by examiner

*Primary Examiner*—Albert Decady
*Assistant Examiner*—Shelly A Chase
(74) *Attorney, Agent, or Firm*—Lisa K. Jorgenson; Robert Iannucci; Seed IP Law Group PLLC (57) ABSTRACT

A method for correction of errors in a word stored in multi-bit memory cells includes associating a full error code, which includes bit error codes and a set error code, for each set of bits of the word stored in a single memory cell. The method includes associating, with each single error, a bit error code which is not associated with other errors and which is indicative of a position of the bit in the word. The set error code is computed based on the bit error codes associated with the bits in the set. The method also checks to make sure that the full error code for the set has not already been associated with other errors. If the error code has already been used for another error, then the method changes both the set error code and at least one of the bit error codes.

23 Claims, 6 Drawing Sheets

| m | | k for two errors in non-correlated positions | | k for two errors in correlated positions | | k for a single error | |
|---|---|---|---|---|---|---|---|
| Bits | Cells | Bits | Cells | Bits | Cells | Bits | Cells |
| 8 | 4 | 7 | 4 | 5 | 3 | 4 | 2 |
| 16 | 8 | 9 | 5 | 6 | 3 | 5 | 3 |
| 32 | 16 | 10 | 5 | 6 | 3 | 6 | 3 |
| 64 | 32 | 12 | 6 | 7 | 4 | 7 | 4 |

*FIG. 1*

| Errors codes for n=2 m=6 k=4 | Source word | Bit position | 1 | 2 | 3 | 4 | 5 | 6 |
|---|---|---|---|---|---|---|---|---|
| | | Single error | 5 | 10 | 6 | 11 | 7 | 9 |
| | | Dual error | 15 | | 13 | | 14 | |
| | Correction word | Bit position | 1 | 2 | 3 | 4 | | |
| | | Single error | 1 | 2 | 4 | 8 | | |
| | | Dual error | 3 | | 12 | | | |

| | | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| Source word | Bit position | 1 | 2 | 3 | 4 | 5 | 6 | 7 | 8 | 9 | 10 | 11 | 12 | 13 | 14 | 15 | 16 |
| | Single error | 5 | 10 | 6 | 11 | 7 | 9 | 17 | 34 | 18 | 35 | 19 | 33 | 20 | 40 | 21 | 42 |
| | Dual error | 15 | 15 | 13 | 13 | 14 | 14 | 51 | 51 | 49 | 49 | 50 | 50 | 60 | 60 | 63 | 63 |
| Source word | Bit position | 17 | 18 | 19 | 20 | 21 | 22 | 23 | 24 | 25 | 26 | 27 | 28 | 29 | 30 | 31 | 32 |
| | Single error | 22 | 43 | 23 | 41 | 24 | 44 | 25 | 46 | 26 | 47 | 27 | 45 | 28 | 36 | 29 | 38 |
| | Dual error | 61 | 61 | 62 | 62 | 52 | 52 | 55 | 55 | 53 | 53 | 54 | 54 | 56 | 56 | 59 | 59 |
| Source word | Bit position | 33 | 34 | 35 | 36 | 37 | 38 | 39 | 40 | 41 | 42 | 43 | 44 | 45 | 46 | 47 | 48 |
| | Single error | 30 | 39 | 31 | 37 | 65 | 130 | 66 | 131 | 67 | 129 | 68 | 136 | 69 | 138 | 70 | 139 |
| | Dual error | 57 | 57 | 58 | 58 | 53 | 53 | 55 | 55 | 54 | 54 | 56 | 56 | 59 | 59 | 63 | 63 |
| Source word | Bit position | 49 | 50 | 51 | 52 | 53 | 54 | 55 | 56 | 57 | 58 | 59 | 60 | 61 | 62 | 63 | 64 |
| | Single error | 71 | 137 | 72 | 140 | 73 | 142 | 74 | 143 | 75 | 141 | 76 | 132 | 77 | 134 | 78 | 135 |
| | Dual error | 206 | 206 | 196 | 196 | 199 | 199 | 197 | 197 | 198 | 198 | 200 | 200 | 203 | 203 | 201 | 201 |
| Correction word | Bit position | 1 | 2 | 3 | 4 | 5 | 6 | 7 | 8 | | | | | | | | |
| | Single error | 1 | 2 | 4 | 8 | 16 | 32 | 64 | 128 | | | | | | | | |
| | Dual error | 3 | 3 | 12 | 12 | 48 | 48 | 192 | 192 | | | | | | | | |

FIG. 4

Error codes for n=2 m=64 k=8

| Error position | Source word | | | | | | Correction word | | | |
|---|---|---|---|---|---|---|---|---|---|---|
| | 1 | 2 | 3 | 4 | 5 | 6 | 1 | 2 | 3 | 4 |
| 1st check | 1 | 0 | 0 | 1 | 1 | 1 | 1 | 0 | 0 | 0 |
| 2nd check | 0 | 1 | 1 | 1 | 1 | 0 | 0 | 1 | 0 | 0 |
| 3rd check | 1 | 0 | 1 | 0 | 1 | 0 | 0 | 0 | 1 | 0 |
| 4th check | 0 | 1 | 0 | 1 | 0 | 1 | 0 | 0 | 0 | 1 |
| Error code | 5 | 10 | 6 | 11 | 7 | 9 | 1 | 2 | 4 | 8 |

*FIG. 5*

|  | Source word | | | Correction word | |
| --- | --- | --- | --- | --- | --- |
| Error position | 1&2 | 3&4 | 5&6 | 1&2 | 3&4 |
| 1st check | 1 | 0 | 0 | 1 | 0 |
| 2nd check | 0 | 1 | 1 | 0 | 1 |
| 3rd check | 1 | 0 | 1 | 0 | 0 |
| 4th check | 0 | 1 | 0 | 0 | 0 |
| Error code | 15 | 13 | 14 | 3 | 12 |

METHOD FOR CORRECTION OF ERRORS IN A BINARY WORD STORED IN MULTI-LEVEL MEMORY CELLS, WITH MINIMUM NUMBER OF CORRECTION BITS

TECHNICAL FIELD

The present invention relates to a method for correction of errors in a binary word stored in multi-level memory cells, with minimum number of correction bits.

BACKGROUND OF THE INVENTION

In order to detect and correct errors in a binary word which contains m bits, which is indicated hereinafter as a source word, techniques are known which are based on the addition of "redundancy" to the source word, i.e., techniques based on the association with the source word, and consequent storage, of a binary word which contains k bits, and is indicated hereinafter as the correction word, in which the k bits are obtained by carrying out k parity checks on k sub-groups selected appropriately from the m bits in the source word.

This association is carried out in the so-called coding process, in which the $2^m$ possible source words, which can be defined by means of m bits, are mapped in a set of an equivalent number of binary words of m+k bits, which are indicated hereinafter as the code words, each of which can be obtained by disposing a source word and the corresponding correction word one after the other and is then stored in the memory.

The value of each of the k correction bits associated during the coding process, depends on the type of parity check carried out. For example, the values of the k correction bits can be associated according to the so-called even parity checking criterion, i.e., the logic value 0 or 1, according to whether in the i-th sub-group there is respectively an even or odd number of logic values 1, is associated with the bit in the i-th position in the correction word, or the values can be associated according to the so-called odd parity checking criterion, i.e., the logic value 0 or 1, according to whether in the i-th sub-group there is respectively an odd or even number of logic values 1, is associated with the bit in the i-th position in the correction word.

The decoding process, in which, on the basis of a code word containing m+k bits stored, there is determination of the corresponding source word with m bits, with detection and correction of any errors which have been generated in it during the storage period, is carried out by executing once again the k parity checks on the bits in the source word, and comparing the correction word thus obtained with the correction word which is read by the memory, in order to generate a check word, which is also of the binary type and indicates the position of the error(s) present in the source word.

In detail, in the decoding process the i-th bit in the correction word, which is obtained by executing the i-th parity check on the i-th sub-group of the binary source word, is compared with the bit which is present in the i-th position in the correction word read by the memory and the logic value 0 or 1, according to whether the two bits compared are respectively the same as one another or different, is then associated with the i-th bit in the check word.

The check word is then compared with a plurality of error codes, each of which is constituted by a binary word which has the same length as the check word, and is associated with a bit or a group of bits in the source word and in the correction word, and is thus indicative of the position of this bit or group of bits. If there is an error, the check word is identical to one of the error codes, and thus, by means of the said association, it is possible to identify the incorrect bit(s).

With the bits in an error code having the logic value 1, there is associated a meaning which is linked to the composition of the sub-groups in the source word, of which the parity is to be checked.

In particular, a bit which is at the logic level 1 in the i-th position in the error code is indicative of the fact that the bit in the source word, which is located in the position associated with this error code, is part of the i-th sub-group of bits in the source word, on which the i-th parity check is carried out.

For example, in the case of the error code "0101" and on the assumption that this is associated with the error in the first bit in the source word, this error code is indicative of the fact that the first bit in the binary source word must form part of the sub-groups of bits on which the first and third parity checks are carried out.

In fact, by this means, if the first bit in the source word is incorrect, both the first bit and the third bit in the correction word which is generated during decoding (obtained from the first and the third parity checks) are different from the corresponding bits in the correction word generated during coding (during which the bit was different), and thus the error code which is obtained by comparing the two correction words has both the first and the third bit set to the logic value 1.

If the k sub-groups in the source word on which the k parity checks are to be carried out are selected appropriately, the error code is in bi-univocal correspondence with the position, within the code word, of the single incorrect bit(s) and thus when this bi-univocal correspondence is known the incorrect bit(s) can be corrected.

If conventional memories are used, in which a single bit is stored in each memory cell, the malfunctioning of a memory cell gives rise to deterioration of a single bit.

If, as is usually the case for this type of memory, the probability of failure of a cell is relatively low, it is sufficient to use a correction code which can detect and correct a single error in the source word; in fact, the probability of occurrence of a plurality of errors within the source word is negligible.

On the other hand, in a multi-level memory, in which several bits are stored in each memory cell, the malfunctioning of even a single memory cell can give rise to a multiple error, i.e., an error in several bits simultaneously.

In fact, as is known, in a floating gate multi-level memory cell the data to be stored is associated with the quantity of electric charge which is stored in the floating gate region (which in turn defines the value of the threshold voltage of the memory cell) and thus the loss or gain of electric charges in the floating gate region of one of the memory cells which is used in order to store the code word can generate, within the code word, a maximum number of errors which is equivalent to the number n of bits stored in the memory cell in which the deterioration of the electric charge has taken place.

In order to be efficient, a method for correction of the errors in a multi-level memory thus makes it necessary to be able to detect and correct multiple errors.

By using the known methods for the correction of multiple errors, there would be a considerable increase in the number of bits in the correction word, for the same length of source word, compared with the number required for correction of a single error, and thus an increase in the memory area, for the same data storage capacity.

It should however be noted that the deterioration of the electric charge stored in the floating gate region of a multi-level memory cell means that the n possible errors which this deterioration generates within the code word are present in positions which are correlated to one another and are known on the basis of the law of association, established a priori in the memory design stage, according to which the bits in the code word have been stored in the memory cells.

If, for example, in each memory cell there are stored n bits, which are disposed in adjacent positions in the binary word, the n possible errors generated by the faultiness of this memory cell can also only be disposed in positions which are adjacent within the binary word.

In order to correct a single error and dual errors present in any positions which are non-correlated to one another, within a code word stored in a conventional memory, for a binary word with m bits to be stored there is required a number k of correction bits such that the following inequality is fulfilled:

$$2^k > 1+m+k+\tfrac{1}{2}\cdot(m+k)\cdot(m+k-1) \qquad 1)$$

The preceding inequality simply expresses the fact that it must be possible to put the $2^k$ possible correction words which can be generated with k bits into bi-univocal correspondence with the m+k possible positions of a single error and with the (m+k)(m+k−1)/2 possible combinations of the positions of two errors; the additional 1 is derived from the fact that it is also necessary to take into consideration the condition of lack of errors.

From 1) it can easily be deduced that in order to correct a single error within the code word the following inequality must be fulfilled:

$$2^k > 1+m+k \qquad 2)$$

On the other hand, for the correction of two errors in positions which are correlated within the code word stored in a multi-level memory, in which 2 bits are stored in one memory cell, for a source word with m bits there is required a number k of correction bits such that the following inequality is fulfilled:

$$2^k > 1 + \frac{3}{2}\cdot(m+k) \qquad 3)$$

which can be deduced from the inequality 1), taking into account the fact that the possible combinations of the positions of two errors in correlated positions are only (m+k)/2.

In general, for correction of r errors in positions which are correlated within a code word stored in a multi-level memory, in which 2 bits are stored in one memory cell, for a binary word with m bits to be stored there is required a number k of correction bits such that the following inequality is fulfilled:

$$2^k > 1 + \frac{2^r-1}{r}\cdot(m+k) \qquad 4)$$

Figure 1:
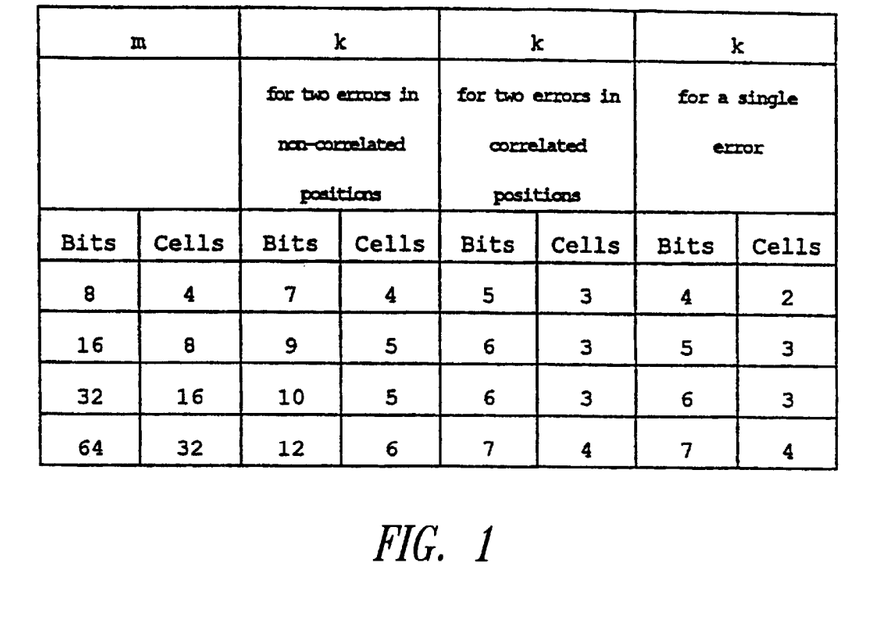
FIG. 1 shows a table which contains the minimum number of correction bits necessary for correction of a single error or a dual error.

For the most significant values of m, the table in FIG. 1 shows the minimum values of k which are required for correction of two errors in any positions, of two errors in adjacent positions, and of a single error, if two bits are stored in each memory cell.

Examination of this table shows that the correction of two errors in correlated positions can be carried out using the same number of additional cells required for the correction of a single error, at least for binary words which have lengths longer than 8 bits.

In particular, analysis of the last two lines of the table shows that in order to carry out the correction of two errors in correlated positions, in the case of a 32-bit binary word (16 cells), it would be necessary to use 6 correction bits (3 cells), with an increase of 19% in the memory matrix area, whereas in order to carry out the correction of two errors in correlated positions, in the case of a 64-bit binary word (32 cells), it would be necessary to use 7 correction bits (4 cells), with an increase of only 12.5% in the memory matrix area.

The foregoing information, provided with reference to the case of two errors in correlated positions, is also valid for the general case of n errors in correlated positions, and this shows immediately that the correlation between the position of the errors within the source word is in general a condition which minimizes the number of correction bits necessary (and thus the number of additional correction cells), which can be calculated by means of the inequality 3) in the case of any n, or by means of the inequality 4) in the case of n=2.

However, in the literature there are not known criteria of definition of the k sub-groups of the source word on which there can be carried out the k operations of checking of parity, in the case of correction of multiple errors in correlated positions, in which there is met the condition of bi-univocality of the correspondence between the error code and the position of the single incorrect bit or the n incorrect bits.

SUMMARY OF THE INVENTION

An embodiment of the present invention provides a method for correction of errors in a binary word stored in multi-level memory cells, which fulfills the condition of requiring the minimum number of correction bits and the condition of complying with the bi-univocality of the correspondence between the error code and the position of the single incorrect bit or the n incorrect bits.

BRIEF DESCRIPTION OF THE DRAWINGS

In order to assist understanding of the present invention, a preferred embodiment is now described, purely by way of non-limiting example, with reference to the attached drawings, in which.

DETAILED DESCRIPTION OF THE INVENTION

The present correction method is described hereinafter with reference to the flowchart in FIG. 2 and, without detracting from its general applicability, relatively to the specific case in which n=2, m=6 and k=4, i.e., relatively to the case of memory cells which store two bits per cell and 10-bit code words (which require 5 memory cells), in which the first 6 bits (3 cells) define the source word and the last 4 bits (2 cells) define the correction word generated during the coding process.

In addition, the present correction method is described hereinafter, without detracting from its general applicability, on the assumption that adjacent positions within the code word are associated with the two bits stored in each memory cell, it being apparent that, in the case in which correlated positions within the code word are associated with the two bits which are stored in each memory cell, everything which is stated hereinafter with reference to two bits which are disposed in adjacent positions also applies to two bits which are disposed in correlated positions.

The fact is also emphasized that the specific application for which the present method is designed, i.e., the correction of errors in positions which are correlated to one another, means that by means of the method it is possible to correct not only a single error but also a pair of errors which are generated by the faultiness of a single memory cell, and not by the faultiness of two separate memory cells, which each generate a single error, since, in this last case, the two errors would be non-correlated to one another.

According to a first aspect of the present invention, the k sub-groups in the source word on which the k parity checks are to be carried out, are defined by taking into consideration initially the possibility of the presence of errors in the correction word read by the memory, since this conditions the definition of the k sub-groups themselves in the manner described in greater detail hereinafter.

Figure 2:
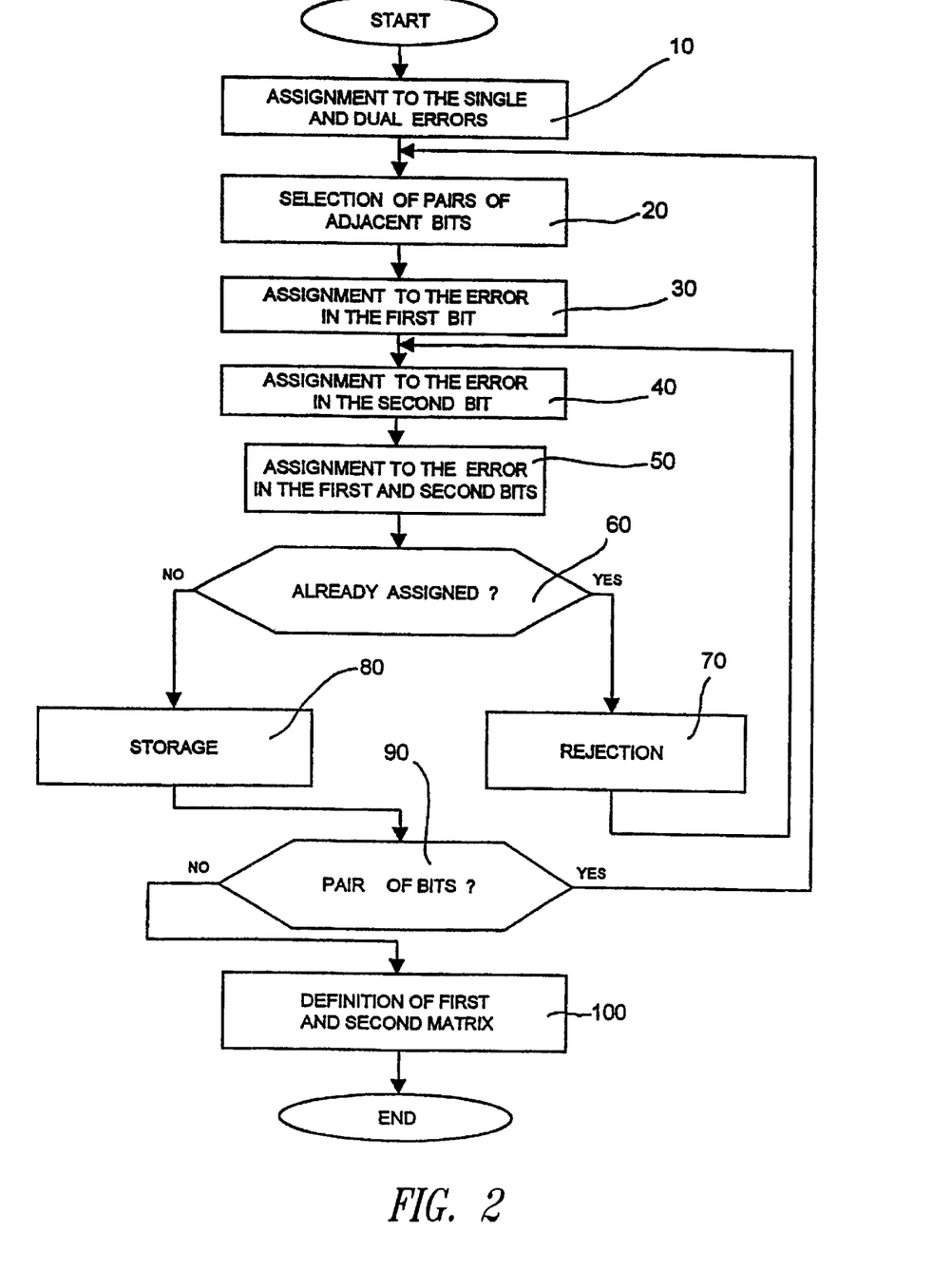
FIG. 2 shows a flowchart of operations relative to association of error codes according to the present invention.

Thus, as illustrated in the flowchart in FIG. 2, initially a block 10 is reached, in which a respective error code is associated with each of the single errors and to each of the dual errors in the correlated position in the correction word.

The criterion according to which the error codes are associated with the positions of the errors in the correction word read by the memory can be deduced from observation of what actually happens during the decoding process in the event of an error in the correction word.

In particular, with reference to the example taken into consideration in the present description, if none of the memory cells, in which there are stored the bits in the source word and in the correction word, is faulty, the correction word generated. during the decoding process will be identical to the correction word read by the memory and thus the corresponding check word will be zero (i.e., it will consist entirely of zeros). This check word thus cannot be used for the association since it is indicative of the lack of errors.

If, on the other hand, the memory cell in which the first two bits in the correction word are stored is faulty, the following situations can occur:

there is a single error in the first of the four correction bits stored and thus the first bit in the correction word generated during the decoding process, obtained from the first parity check, will not be equivalent to the first bit in the correction word stored, which was generated during the coding process, and thus the first parity check will be unsuccessful, whereas the successive checks will be correct and will provide a positive result; consequently, the error code "0001" ("1" in decimal representation) is advantageously associated with this single error in the first bit in the correction word stored, indicating the fact that the result of the first check was negative (first bit at the logic level 1) and that the result of the subsequent three checks was positive (subsequent three bits at the logic level 0);

there is a single error in the second of the four correction bits stored and thus the second parity check will be unsuccessful, whereas the subsequent checks will be correct; the error code "0010" (representing decimal "2") is advantageously associated with this error;

there is a dual error in the first and second correction bits stored and thus both the first and the second parity checks will be unsuccessful; the error code "0011" (representing decimal "3") is thus advantageously associated with this dual error.

Similarly, if the memory cell in which the third and fourth correction bits are stored is faulty, the following situations can occur:

there is a single error in the third correction bit stored and thus the third parity check will be unsuccessful; the error code "0100" (representing decimal "4") is advantageously associated with this error;

there is a single error in the fourth correction bit stored and thus the fourth parity check will be unsuccessful; the error code "1000" representing decimal "8") is advantageously associated with this single error;

there is a dual error in the third and fourth correction bits stored and thus both the third and the fourth parity checks will be unsuccessful; the error code "1100" (representing decimal "12") is advantageously associated with this dual error.

Thus, in the light of the foregoing description, in general, in block 10, an error code having the i-th bit set to the logic value 1 is associated with the single error in the i-th bit in the correction word stored, whereas with the dual error in the i-th bit and the subsequent bit in the correction word stored there is associated an error code which is obtained by carrying out the EXCLUSIVE OR, or EX-OR operation, between each pair of bits in corresponding positions in the error codes associated with the single error in the i-th bit and to the single error in the subsequent bit, and thus have the i-th bit and the subsequent bit set to the logic value 1.

The association of error codes to the single and dual errors in the correction word conditions the association of the error codes to the single and dual errors in the source word, since, in the selection of the sub-groups in the source word, on which the parity checks are to be carried out, it is necessary to take into account the fact that the error codes 1, 2, 3, 4, 8 and 12 are already associated with errors in the correction word stored.

Thus, from block 10, there is transition to a series of blocks in which there are taken into consideration, one at a time, successive separate pairs of adjacent bits in the source word (i.e., in accordance with the foregoing description, there are taken into consideration, one at a time, the series of n bits stored in a single memory cell), and for each of them there are determined the error codes to be associated with the single error bits and to the dual error in both bits.

In the example which is taken into consideration in the present description, the pair formed by the first and the second bits, then the pair formed by the third and fourth bits, and finally the pair formed by the fifth and sixth bits in the source word, are initially taken into consideration.

In detail, from block 10, there is transition to a block 20, in which there is selected a pair of adjacent bits in the source word, to be taken into consideration for association of the error codes.

From block 20, there is then transition to a block 30, in which the smallest error code from amongst those which have not yet been associated with other errors is associated with the single error in the first bit in the pair of bits selected.

From the block 30, there is then transition to a block 40, in which the smallest error code from amongst those which have not yet been associated with the other errors and is subsequent to that associated with the first bit in the pair of bits considered is associated with the single error in the second bit in the pair of bits selected.

From block 40, there is then transition to a block 50, in which an error code, which is obtained by carrying out the EX-OR operation on each corresponding pair of bits in the error codes associated with the single errors, is associated with the dual error in both bits in the pair of bits selected.

From the block 50, there is then transition to a block 60, in which it is checked whether the error code determined in block 50 has already been associated with other errors in the source word or in the correction word.

If the error code has already been associated with other errors (YES output from block 60), this does not make it possible to comply with the criterion of bi-univocality between error codes and error positions, and thus, from block 60, there is transition to a block 70, otherwise, if the error code has not been associated with other errors (NO output from block 60), this makes it possible to respect the criterion of bi-univocality between error codes and error positions, and thus, from block 60, there is transition to block 80.

In block 70, there is rejection of the error code associated with the dual error in both the bits in the pair required, since it does not fulfil the said condition of bi-univocality, and of the error code associated with the error in the second bit in the pair of bits selected.

From block 70, there is then transition to block 40 once more, in order to determine a new error code to be associated with the error in the second bit in the pair of bits considered.

The operations described with reference to blocks 40–70 are then repeated, until with the error in the second bit in the pair of bits selected there is associated an error code which makes it possible to obtain an error code associated with the dual error in both bits which fulfils the said condition of bi-univocality.

When this error code has been determined, there is transition to block 80, in which the error code associated with the dual error and the two error codes associated with the two single errors are stored.

From block 80, there is then transition to a block 90, in which it is checked whether there is a subsequent pair of adjacent bits in the source word to be taken into consideration for the association of error codes.

If there is a subsequent pair of bits in the source word to be taken into consideration (YES output from block 90), then from block 90 there is transition once more to block 20 in order to repeat the operations described on a subsequent pair of bits in the source word, otherwise, if all the pairs of adjacent bits in the source word have been taken into consideration (NO output from block 90), then from block 90 there is transition to a block 100 which is described hereinafter.

With reference to the example taken into consideration in the present description, by means of the above-described operations, the error code "0101" ("5" in decimal representation) is associated with the error in the first bit in the source word and the error code "0110" ("6" in decimal representation) is associated with the error in the second bit in the source word.

The error code associated with the dual error in both the bits would therefore be "0011" (representing decimal "3"), which however is already associated with an error in the correction word and thus the association of the error code "0110" to the error in the second bit in the pair of bits concerned is rejected and the error code "0111" (representing decimal "7") is associated with the error in the second bit.

However, this also does not make it possible to fulfil the aforementioned condition of bi-univocality and thus the above-described operations are repeated.

It is simple to check that the smallest error code which can be associated with the error in the second bit in the source word, which does not give rise to ambiguity, is "1010" (representing decimal "10"), which, together with the error code "0101" associated with the error in the first bit in the source word, gives rise, for the dual error in the first and second bits in the source word, to an error code "1111" (representing decimal "15").

Figure 3:
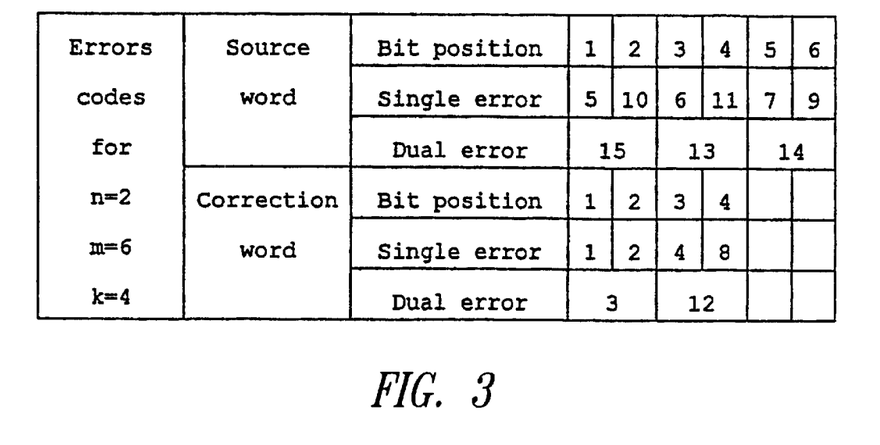
FIG. 3 shows a table which contains the error codes relative to a first use of the present method.

The table in FIG. 3 shows the error codes associated with the single and dual errors in the example taken into consideration in the present description.

The method for association of the error codes to the bit errors in the source word can be extended to any values of m and k and can be executed by means of a simple calculation program.

Figure 4:
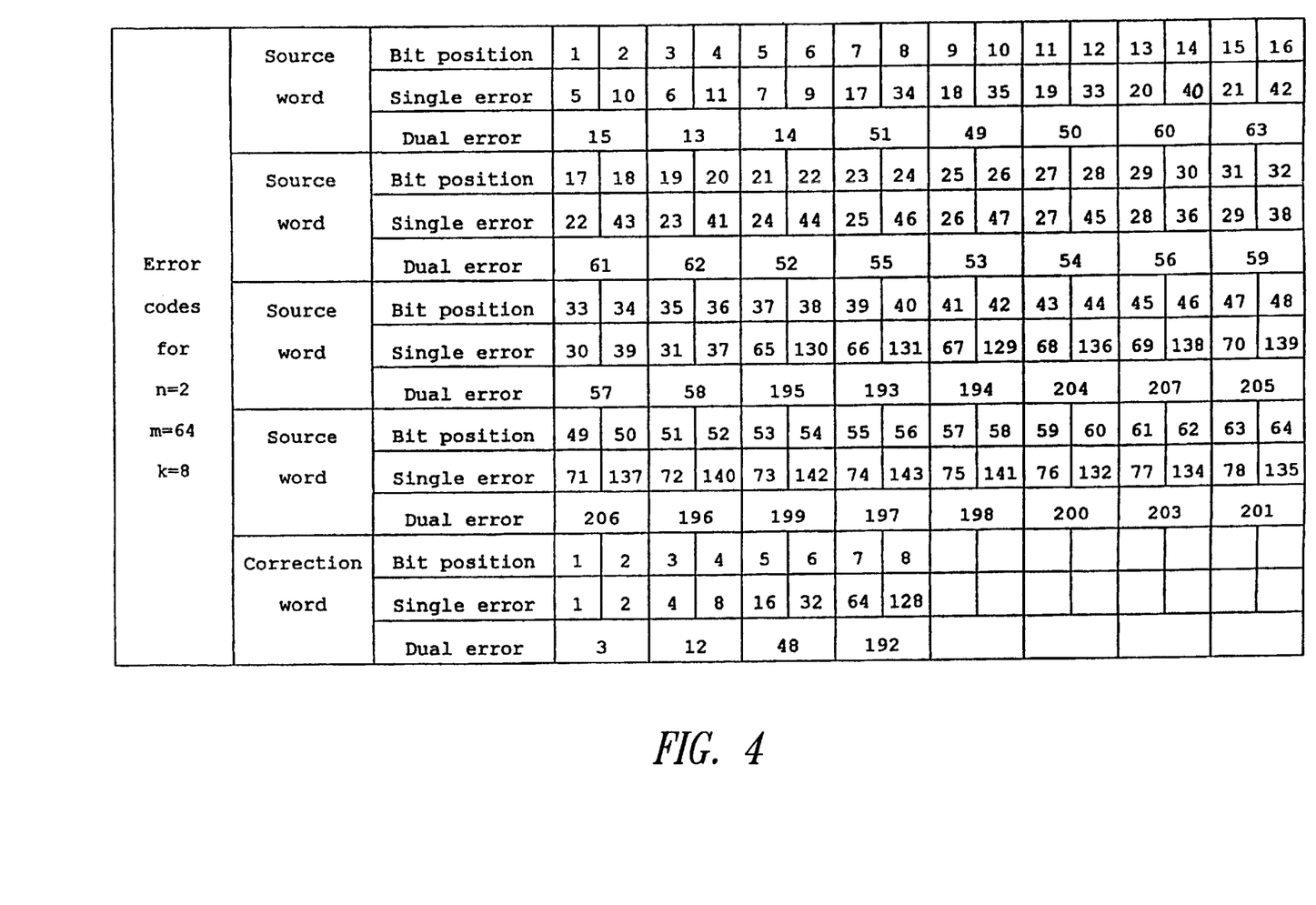
FIG. 4 shows a table which contains the error codes relative to a second use of the present method.

For example, the table in FIG. 4 shows the error codes determined in the above-described manner for a recurrent application in which n=2, m=64 and k=8, i.e., for 36 memory cells altogether, of which 32 are for the source word and 4 are for the correction word.

The method for association of the error codes to the bit errors in the source word can also be extended to values of n which are greater than two.

For any values of n, sets of n adjacent bits in the code word (i.e., the bits stored in a single memory cell) are selected one at a time and for each of them the error codes are associated with each of the n single errors.

With reference to association of the error codes to multiple errors, the fact must be taken into account that for values of n which are greater than two it is necessary to determine not only the error code to be associated with the multiple error in all the n bits but also all the error codes to be associated with each of the multiple errors with r bits, in which 1<r<n.

The error codes to be associated with the multiple error with n bits, and to the multiple errors with r bits are thus determined in the above-described manner for the case of n=2, i.e., by checking whether the error code has already been associated with other errors in the code, and, if it has already been associated with other errors, rejecting one or more error codes associated with the individual errors, and then searching repeatedly for other error codes to be associated with these single errors, until the error code associated with the multiple error is found to be non-associated with other errors.

For example, if n=4, when the error codes have been associated with each of the four single errors, it is necessary to determine not only the error code to be associated with the multiple error in all four bits but also the error codes to be associated with each of the multiple errors in three bits, and to each of the multiple errors in two bits.

With reference once again to the flowchart in FIG. 2, in block 100, to which transition takes place if all the pairs of bits in the source word have been selected and three error codes have been associated with each of them (two for the single errors and one for the dual error), there are defined:

a first matrix, or "mask", to be used in order to determine the k sub-groups of bits in the source word on which the checking operations are to be carried out during the coding and decoding processes and in order to determine the position of the single errors within the source word during the decoding process; this matrix, which is commonly known as the parity matrix, is constructed by recording in matrix form, in the manner described hereinafter, the error codes associated with the single errors, both in the source word and in the correction word; and a second matrix or "mask", to be used only during the decoding process, in order to determine the position of the dual errors within the source word, which is defined by recording in matrix form, in the manner described hereinafter, the error codes associated with the dual errors both in the source word and in the correction word.

Figure 5:
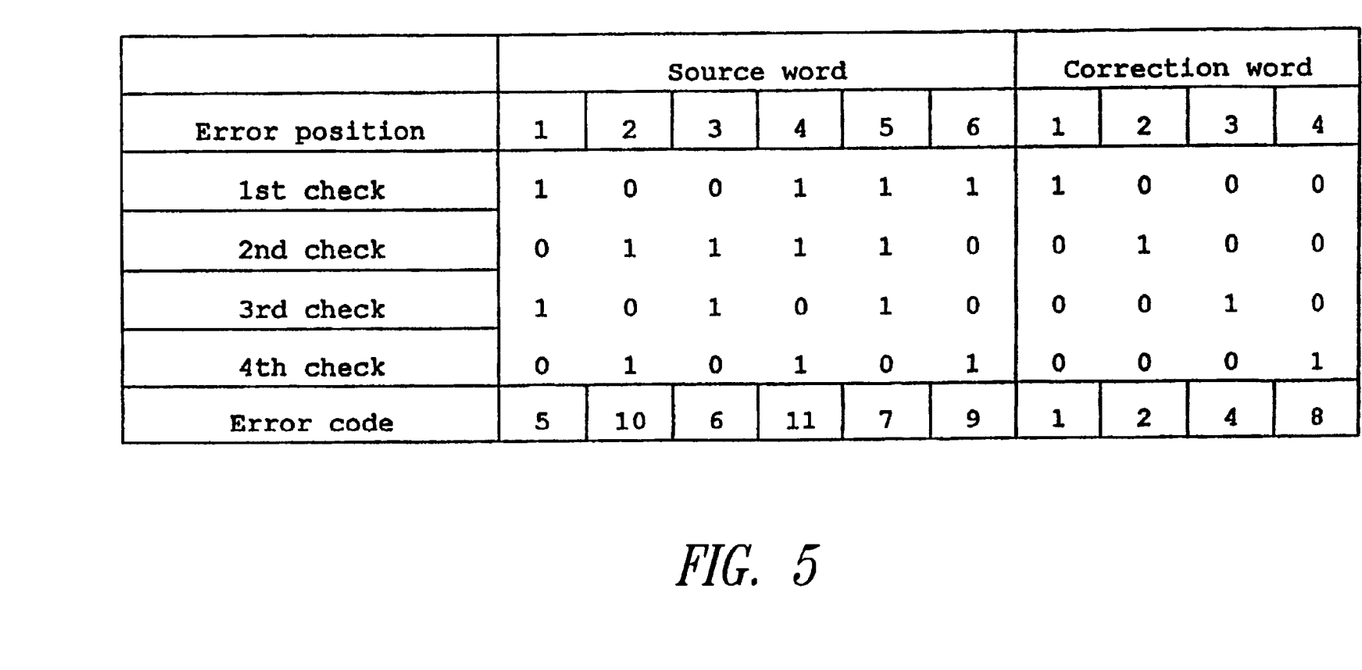
FIG. 5 shows a first correction matrix obtained by means of the present method.
Figure 6:
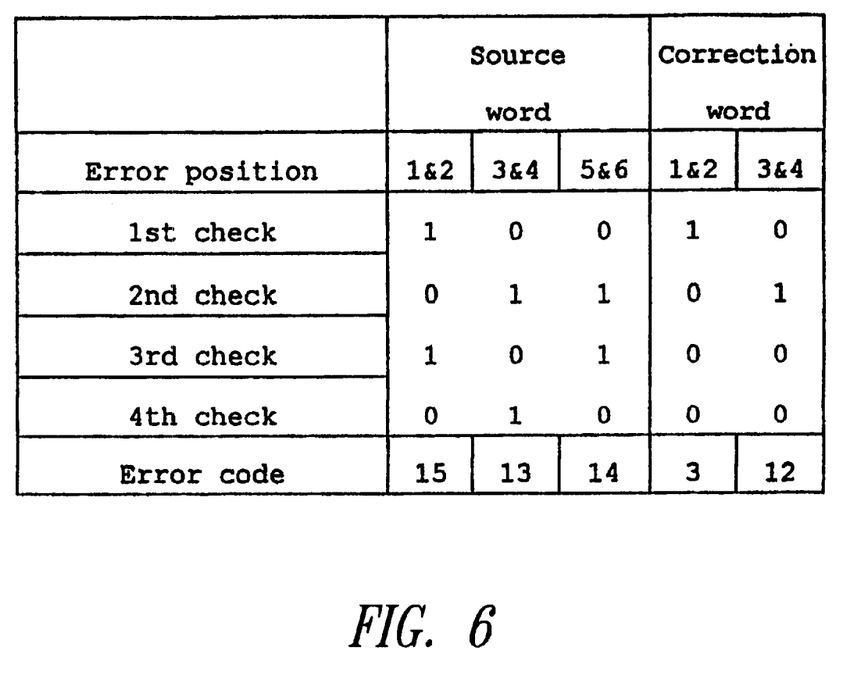
FIG. 6 shows a second correction matrix obtained by means of the present method.

FIGS. 5 and 6 illustrate two tables which contain respectively the first and the second matrix relative to the example given in the present description.

In particular, in the columns of the first matrix there are progressively recorded the error codes associated with the positions of the single incorrect bits within the source word and then the error codes associated with the positions of the single incorrect bits within the correction word stored, with the least significant bit disposed in the topmost line, whereas in the columns of the second matrix there are progressively recorded the error codes associated with the dual errors in correlated positions in the source word and in the correction word, with the least significant bit disposed in the topmost line.

The error codes which are associated with the individual errors in the source word define, within the first matrix, a first sub-matrix relative to the source word, whereas the error codes which are associated with the individual errors in the correction word define, within the first matrix, a second sub-matrix relative to the correction word.

The first sub-matrix relative to the source word shows graphically the above-described ratio which exists between the bits which have a logic value 1 in an error code, and the subgroups of bits in the source word, on which the checking operations are to be carried out during the coding and decoding process.

In particular, the i-th line of the first sub-matrix is indicative of the position of the bits in the source word which form the i-th sub-group of bits on which the i-th checking operation is to be carried out, and, in greater detail, in the i-th checking operation the j-th bit in the source word belongs to the i-th sub-group only if in the i-th line the j-th bit assumes the logic value 1.

On the other hand, the second sub-matrix relative to the correction word shows, during the coding process, the positions within the correction word in which there must be loaded the results of the parity checks, and, during the decoding process, the positions of the bits in the correction word with which the results of the parity checks must be compared.

In particular, in the coding process, the bit with the logic value 1 in the i-th line is indicative of the position, within the correction word, in which there must be loaded the result of the i-th checking operation carried out on the i-th sub-group in the source word, whereas in the decoding process, it is indicative of the position of the bit in the correction word with which the result of the i-th checking operation carried out on the i-th sub-group in the source word must be compared.

The first and second matrices are also used in the decoding process in order to determine the error which is present in the source word or in the correction word which is associated with it.

In fact, in the decoding process, when the operations of checking on the various sub-groups of bits and of comparison between the correction word read in the memory and that of decoding have been carried out, a check word is generated and compared with the error codes contained in the columns of the first and the second matrix.

In the presence of a single error or of a dual error in correlated positions in the source word or in the correction word, the check word obtained in the decoding process will thus be equivalent to one of the error codes contained in the columns of the first or second matrix, and in particular, it will be equivalent to the error code associated with this single or dual error.

When this error code is known, the position of the single or dual error (which can be read in the "Error position" line respectively in the table in FIG. 5 or FIG. 6, corresponding to the column in which the error code is contained) will immediately be known and they can thus be corrected.

With reference to the matrix in FIG. 5, both during the coding process and during the decoding process, the first parity check will be carried out on the sub-group of bits formed from the 1st, 4th, 5th and 6th bits in the source word, the second parity check will be carried out on the sub-group of bits formed from the 2nd, 3rd, 4th and 5th bits, the third parity check will be carried out on the sub-group of bits formed from the 1st, 3rd and 5th bits, and the fourth parity check will be carried out on the sub-group of bits formed from the 2nd, 4th and 6th bits.

In addition, during the coding process, the result of the first checking operation will be loaded in the first bit in the correction word, the result of the second checking operation will be loaded in the second bit in the correction word, the result of the third checking operation will be loaded in the third bit in the correction word, and the result of the fourth checking operation will be loaded in the fourth bit in the correction word.

On the other hand, in the decoding process, the result of the first checking operation will be compared with the bit set in the first position in the correction word, the result of the second checking operation will be compared with the bit set in the second position in the correction word, the result of the third checking operation will be compared with the bit set in the third position of the correction word, and the result of the fourth checking operation will be compared with the bit set in the fourth position in the correction word.

In addition, during the decoding process, if the check word is not zero, it is compared with the error codes which are contained in the columns of the matrices in FIGS. 5 and 6 in order to identify the error code which is identical to it and then the decimal representation of this error code, which is indicative of the position of this single or dual error within the source word or the correction word, is read in the lowest line of the matrix. At this point, the single or dual error can thus be corrected.

Figure 7:
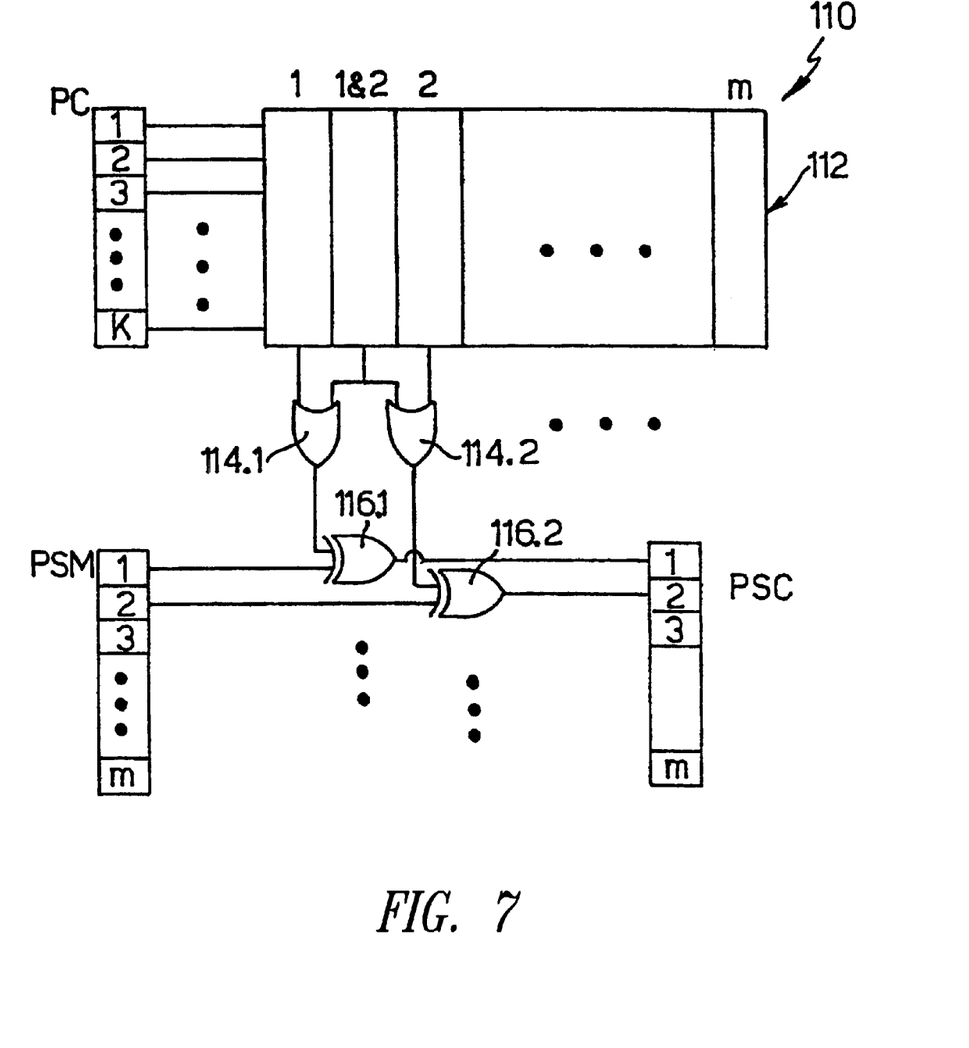
FIG. 7 shows a logic diagram of an error correction circuit.

FIG. 7 shows the correction circuit which is used for correction of the errors in the source word used, which is indicated as PSM in the figure.

As illustrated in this figure, the correction circuit, which is designated 110 as a whole, comprises a decoder stage 112, which receives as input the check word obtained in the decoding process, and indicated in the figure as PC, and supplies as output, on the basis of the decoding matrices of the type illustrated in FIGS. 4 and 5, a binary correction string, which has a length of 3 m/2 bits, and consists of a plurality of triads of bits, each of which is associated with a respective pair of bits in the source word stored, PSM, which bits are stored in a single multi-level memory cell, and are a pair of adjacent bits in the example considered.

In particular, in each triad, the first bit is associated with the single error in the first of the two adjacent bits in the source word used, PSM, with which the triad is associated, the third bit is associated with the single error in the other of the two adjacent bits in the source word stored, PSM, and the second bit, which is interposed between them, is associated with the dual error in both the adjacent bits in the source word, PSM.

In other words, as shown in FIG. 7, the first bit in the binary correction string is associated with the error in the first bit in the source word, PSM, the second bit in the binary correction string is associated with the error in the first and second bits in the source word, PSM, the third bit in the binary correction string is associated with the error in the second bit in the source word, PSM, the fourth bit in the binary correction string is associated with the error in the third bit in the source word, PSM, and so on.

Each of the bits in the binary correction string also assumes a logic value 1, if the bit or bits in the source word, PSM, associated with it, is or are incorrect, and thus, since the present method can correct a single error or two errors in correlated positions, a binary correction string will have only one bit which is set to the logic value 1.

In addition, since, as initially emphasized, a pair of adjacent bits in the source word, PSM, are stored in a single memory cell, and owing to the correspondence between bits in the binary correction string and bits in the source word, PSM, each pair of OR logic gates operates on a pair of bits in the binary correction string, which are associated with errors in a pair of bits which are stored in a single cell.

The correction circuit 110 additionally comprises m OR logic gates 114.1, 114.2, . . . , one for each bit in the binary correction string which is set to an odd position.

In particular, the OR logic gates 114.1, 114.2, . . . are organized in pairs, and each pair operates on a respective triad of bits in the binary correction string, i.e., a first pair of OR logic gates operates on the triad of bits which is formed by the first, the second, and the third bits in the binary correction string, a second pair of OR logic gates operates on the triad of bits formed by the fifth, sixth and seventh bits in the binary correction string, and so on.

In detail, in each pair of OR logic gates 114.1, 114.2, . . . , a first OR logic gate carries out the OR logic operation between the first bit in the corresponding triad which is set to an odd position, and the bit which is set to an even position, and a second OR logic gate carries out the OR logic operation between the bit which is set to an even position, and the second bit which is set to an odd position.

The correction circuit 110 additionally comprises m EX-OR logic gates 116.1, 116.2, . . . , each of which is associated with a respective OR logic gate 114.1, 114.2, . . . , and carries out the EXCLUSIVE OR operation, between the bit which is supplied as output by the respective OR logic gate, and the bit in the source word, PSM, which is associated with the bit in the binary correction string which is set to an odd position, on which the OR logic gate itself operates.

In other words, the first EX-OR logic gate 116.1 carries out the EXCLUSIVE OR operation between the bit supplied as output from the first OR logic gate, and the first bit in the source word, PSM, the second EX-OR logic gate 116.2 carries out the EXCLUSIVE OR operation between the bit supplied as output from the second OR logic gate, and the second bit in the source word, PSM, stored, and so on.

The outputs of the m EX-OR logic gates 116.1, 116.2, . . . , thus define a correct source word, which is indicated as PSC in the figure.

The functioning of the correction circuit 110 is apparent from the description provided.

In fact, the decoding of the check word, PC, ensures that the binary correction string has a bit which is set to the logic value 1, in the position which corresponds to that of the single error within the source word, PSM, or to that of the error in two adjacent bits.

Consequently, the output of one of the OR logic gates 114.1, 114.2, . . . , in particular of the one which operates on the bit which is set to the logic level 1 in the binary correction string, is set to the logic level 1, and thus the EX-OR logic gate 116.1, 116.2, . . . associated with it will supply as output the complement of the bit in the source word, PSM, supplied to it, thus correcting the error in this bit.

The advantages of the present correction method are apparent from the foregoing description.

Finally, it is clear that modifications and variants can be made to the correction method which is described and illustrated here, without departing from the protective scope of the present invention.

What is claimed is:

1. Method for correction of errors in a binary word stored in multi-level memory cells, each of which contains a set of n bits, using a minimum number of correction bits, wherein for each set of bits in said binary word stored in a single memory cell, the method comprises the following steps:

a) associating, with a single error in each bit in said set of bits, a respective error code which is not associated with other errors in said binary word and is indicative of a position of the incorrect bit in the binary word;

b) for each sub-set of multiple errors in bits in said set of bits, carrying out the following steps:

b1) associating, with said sub-set of multiple errors, a respective error code which is dependent on the error codes associated with the single errors in the bits in the sub-set;

b2) checking whether the error code associated with said sub-set of multiple errors has already been associated with other errors in said binary word;

b3) if the error code associated with said sub-set of multiple errors has already been associated with other errors in said binary word, carrying out the following steps:

b31) rejecting said error code associated with said sub-set of multiple errors and at least one of the error codes associated with the single errors in the bits in the sub-set;

b32) associating, with the single error associated with the error code rejected, a new error code which is not associated with other errors in said binary word; and b33) repeating said steps from b1) to b3) until the error code associated with said sub-set of multiple errors is not associated with other errors in said binary word.

2. Method for correction according to claim 1 wherein said step a) comprises the steps of:

a1) associating, with the single error in a first one of the bits in said set, the smallest error code which is not associated with other errors; and a2) associating respective error codes with the single errors in the other bits in said set, said error codes being the smallest from amongst the error codes not associated with other errors and being in succession relative to one another and to the error code associated with said first bit.

3. Method for correction according to claim 1 wherein said step b1) comprises the step of:

b11) associating, with said sub-set of multiple errors, an error code which is obtained by carrying out an EXCLUSIVE OR logic operation between the error codes associated with each of the single errors in the sub-set.

4. Method for correction according to claim 1 wherein said step b32) comprises the step of:

b321) associating a new error code with the single error associated with the error code rejected, said new error code being the smallest from amongst the error codes not associated with other errors.

5. Method for correction according to claim 4, wherein in said step b321), said new error code associated with the single error is subsequent to said error code rejected.

6. Method for correction according to claim 1 wherein said step b) additionally comprises the steps of:

b4) if the error code associated with said sub-set of multiple errors has not been associated with other errors, storing said error code associated with said sub-set of multiple errors and the error codes associated with each of the single errors in said sub-set.

7. Method for correction according to claim 1 wherein said binary word is a source word with m bits which forms, together with a correction word with k bits associated with it, a code word; said k bits in said correction word being obtained by carrying out k parity checks on k sub-sets of bits in said source word.

8. Method for correction according to claim 7 wherein for said correction word, said association step comprises the steps of executing, for each set of bits in said correction word which are stored in a single memory cell, the following steps:

c) associating, with each single error in said set of bits, an error code which is not associated with other errors; and d) for each sub-set of multiple errors in said set of bits, associating, with said sub-set of multiple errors, an error code which is dependent on the error codes associated with each of the single errors in the sub-set itself.

9. Method for correction according to claim 8 wherein said step c) comprises the step of:

c1) associating, with a single error in the i-th bit in said correction word, an error code which has an i-th bit set to a first logic value and the other bits set to a second logic value.

10. Method for correction according to claim 9 wherein said first logic value is the logic value 1.

11. Method for correction according to claim 8 wherein said step d) comprises the step of:

d1) associating, with each sub-set of multiple errors in said set of bits, an error code which is obtained by carrying out an EXCLUSIVE OR logic operation between the error codes associated with each of the single errors in the sub-set itself.

12. Method for correction according to claim 7, further comprising the step of:

e) defining a first matrix having columns in which there are progressively recorded the error codes associated with the single errors in the bits in said source word and in said correction word; the error codes associated with the single errors in the bits in said source word defining a first sub-matrix, having lines that are indicative of the composition of said sub-sets of bits in the source word, on which said checking operations are to be carried out; the error codes associated with the single errors in the bits in said correction word defining a second sub-matrix having lines that are indicative of the positions within the correction word, in which the bits derived from said checking operations are placed.

13. Method for correction according to claim 12 wherein an i-th line of said first sub-matrix is indicative of positions of the bits in the source word, which form an i-th sub-set of bits, on which an i-th checking operation is to be carried out.

14. Method for correction according to claim 13 wherein in said i-th checking operations, a j-th bit in said source word belongs to the i-th sub-set, if the j-th bit assumes a third logic value, in the i-th line of said first sub-matrix.

15. Method for correction according to claim 14 wherein said third logic value is the logic value 1.

16. Method for correction according to claim 14 wherein in the i-th line of said second sub-matrix, there is present a single bit, which is set to a fourth logic value, and a position of this single bit set to said fourth logic value is indicative, in a coding process, of a position within the correction word, in which there must be loaded the bit derived from the i-th checking operation carried out on the i-th sub-set in said source word, and is indicative, in a decoding process, of a position within the correction word for the bit, with which the result of the i-th checking operation carried out on the i-th sub-set in the source word must be compared.

17. Method for correction according to claim 16 wherein said fourth logic value is the logic value 1.

18. Method for correction according to claim 12, further comprising the step of:

f) defining a second matrix, having columns in which are progressively recorded the error codes associated with the multiple errors in the bits in said source word and in said correction word.

19. A method for correction of errors in a binary word stored in multi-level memory cells, each of which contains a respective set of plural bits, the method comprising:

for each bit of each set of plural bits, associating a respective, unique bit error code that is indicative of a position of the bit in the binary word; and for each set of plural bits, associating a respective, unique set error code that is computed based on the bit error codes associated with the bits in the set.

20. The method of claim 19 wherein the act of associating a respective, unique set error code for each set of plural bits includes exclusive-Oring with each other the bit error codes associated with the bits of the set to obtain the set error code for the set.

21. The method of claim 19 wherein the binary word is a source word with m bits which forms, together with a correction word with k bits associated with it, a code word; the k bits in the correction word being obtained by carrying out k parity checks on k sub-sets of bits in the source word.

22. The method of claim 21 wherein the correction word is stored in multi-level memory cells, each of which contains a respective set of plural bits, the method further comprising:

for each bit in each set of plural bits in the correction word, associating a respective, unique bit error code that is indicative of a position of the bit in the correction word; and for each set of plural bits in the correction word, associating a respective, unique set error code that is computed based on the bit error codes associated with the bits in the set.

23. A correction system for correction of errors in a binary source word having m bits, comprising:

a group of multi-level memory cells, each of which contains a respective set of plural bits of the source word;

a decoder stage having an input that receives a check word and an output at which a correction word is produced based on the check word, the correction word having 3 m/2 correction bits including a correction bit for each bit of the source word and a correction bit for each set of plural bits of the source word;

m OR gates organized into pairs of first and second OR gates, each pair corresponding to a respective set of plural bits of the source word, the first OR gate having a first input that receives a first correction bit corresponding to a first bit of the corresponding set of plural bits of the source word, a second input that receives a second correction bit corresponding to first and second bits of the corresponding set of plural bits, and an output; and the second OR gate having a first input that receives a third correction bit corresponding to the second bit of the corresponding set of plural bits of the source word, a second input that receives the second correction bit, and an output; and m exclusive-OR gates organized into pairs of first and second exclusive-OR gates corresponding respectively to the pairs of OR gates, the first exclusive-OR gate of each pair having a first input that receives the first bit of the corresponding set of plural bits of the source word, a second input coupled to the output of the first OR gate of the corresponding pair of OR gates, and an output; and the second exclusive-OR gate of each pair having a first input that receives the second bit of the corresponding set of plural bits of the source word, a second input coupled to the output of the second OR gate of the corresponding pair of OR gates, and an output; the outputs of the m exclusive-OR gates together output a corrected word that corresponds to the source word with individual errors in the source word being corrected.

* * * * *

UNITED STATES PATENT AND TRADEMARK OFFICE
CERTIFICATE OF CORRECTION

PATENT NO.   : 6,557,138 B1
DATED        : April 29, 2003
INVENTOR(S)  : Alberto Modelli Page 1 of 1

It is certified that error appears in the above-identified patent and that said Letters Patent is hereby corrected as shown below:

<u>Title page,</u>
Item [73], Assignee's address data "Agrat Brianza (IT)" should read as -- Agrate Brianza (IT) --.

Signed and Sealed this

Thirtieth Day of September, 2003

JAMES E. ROGAN
*Director of the United States Patent and Trademark Office*